United States Patent
Juhn et al.

(10) Patent No.: US 6,642,725 B2
(45) Date of Patent: Nov. 4, 2003

(54) METHOD OF TESTING RADIATION FOR A SDRAM

(75) Inventors: Li-Shen Juhn, Taoyuan Hsien (TW); Kuang-Shyr Wu, Taoyuan Hsien (TW); Maw-Ching Lin, Taoyuan Hsien (TW)

(73) Assignee: Chung-Shan Institute of Science and Technology, Taoyuan (TW)

( * ) Notice: Subject to any disclaimer, the term of this patent is extended or adjusted under 35 U.S.C. 154(b) by 320 days.

(21) Appl. No.: 09/895,549

(22) Filed: Jun. 28, 2001

(65) Prior Publication Data

US 2003/0001597 A1 Jan. 2, 2003

(51) Int. Cl.[7] .................. G01R 31/302; G01R 31/00; G01R 31/26; G21G 5/00; G11G 29/00
(52) U.S. Cl. ................ 324/750; 324/501; 324/765; 250/492.2; 714/718
(58) Field of Search .................. 324/750, 501, 324/765; 250/492.1, 492.2; 714/718

(56) References Cited

U.S. PATENT DOCUMENTS 4,786,865 A * 11/1988 Arimura et al. ............ 324/765
6,160,407 A * 12/2000 Nikawa ...................... 324/750

* cited by examiner

*Primary Examiner*—Jay Patidar
*Assistant Examiner*—Timothy J. Dole
(74) *Attorney, Agent, or Firm*—J. C. Patents

(57) ABSTRACT

A method for testing for radiation on a synchronized dynamic random access memory (SDRAM), wherein an irradiation controller irradiates the SDRAM. The status of the SDRAM after a radiation test are calculated. The radiation tests comprise SEU, micro latch-up, SEL and get rapture tests. From the radiation test, we can understand the condition of the SDRAM before and after the radiation test.

4 Claims, 3 Drawing Sheets

METHOD OF TESTING RADIATION FOR A SDRAM

BACKGROUND OF THE INVENTION

1. Field of Invention

The present invention relates to a method of testing radiation. More particularly, the present invention relates to a method of testing radiation for a SDRAM.

2. Description of the related Art

In the field of space technology, electronic devices that are utilized in space have to be tested with an anti-radiation test. In wireless satellite transmissions, for example, the electronic devices used for satellite communications have to pass a radiation test. Those devices have to have high resistance to radiation and good readability for use in space.

The radiation test for a synchronized dynamic random access memory (SDRAM) is very important, because the SDRAM is an important device for transmitting data. There are various methods that can detect the damage of a SDRAM and its reliability during the radiation process. In general, in a single event upset (SEU) method, when the SDRAM is radiated, the written status of the SDRAM will change. However, when the status of the SDRAM is rewritten, the SDRAM can still function. In a single event latchup (SEL) method, after the SDRAM is radiated, the SDRAM cannot function. However, when the SDRAM is restarted, the SDRAM can function again. Micro latch-up and get rapture tests are more reliable tests used to test the SDRAM and can obtain more details about the tested device. The micro latch-up test detects the location of a non-functional region in the SDRAM after the SDRAM has been radiated and tested, but the SDRAM does not have to restart its program. The get rapture test can indicate whether the SDRAM is permanently damaged after the radiation test.

With the increasing improvement of semiconductor technology and the demand of higher speeds for computers, there has been gradual development in the memory capacity of the SDRAM device. However, a SDRAM is still a newly developed device, so currently there is no literature regarding how a SDRAM will be affected under a radiation test. Therefore, the condition of a SDRAM that is subjected to the radiation test is still unknown.

SUMMARY OF THE INVENTION

It is an object of the present invention to provide a method of testing radiation for a synchronized dynamic random access memory (SDRAM). The method comprises performing the SEU, the micro latch-up, the SEL and the get rapture tests on the SDRAM. Thus, the condition of the SDRAM after the radiation test can be determined, and the reliability of the SDRAM can be improved.

It is another object of the present invention to provide a method of testing radiation for a SDRAM. The method comprises performing a self-test by a test device to ensure that all the test devices are functioning properly. A 'start' signal is transmitted from an irradiation controller to an irradiation room, and periodic radiation is produced continuously. Each cycle of the periodic radiation consists of on/off regions. The test device checks whether the SDRAM is in an off region. If no radiation is detected on the SDRAM, a test pattern is then written from the test device to the SDRAM. The readings obtained from the SDRAM are calculated to obtain a difference sum. When the SDRAM is in an on region, wherein radiation is detected on the SDRAM, the test device checks if there is an abnormal current present in the SDRAM. If there is an abnormal current present in the SDRAM, the test device goes back to its self-test step. However, if there is no abnormal current present in the SDRAM, the test device checks whether the SDRAM is in an off region. Once the SDRAM is in the off region, a test pattern is written from the test device to the SDRAM. Readings, which are obtained from the SDRAM before and after the test, are calculated, and a difference sum of these readings is obtained.

The test device checks whether a 'stop' signal is sent out by the radiation controller, if the radiation controller dose not send out the 'stop' signal, the test process goes back to the step of writing a test pattern from the test device to the SDRAM, and the readings, which are obtained from the SDRAM before and after the test are calculated, wherein a difference sum of these readings is obtained.

Both the foregoing general description and the following detailed description are exemplary and explanatory only and are not restrictive of the invention, as claimed.

BRIEF DESCRIPTION OF THE DRAWINGS

The accompanying drawings are included to provide a further understanding of the present invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
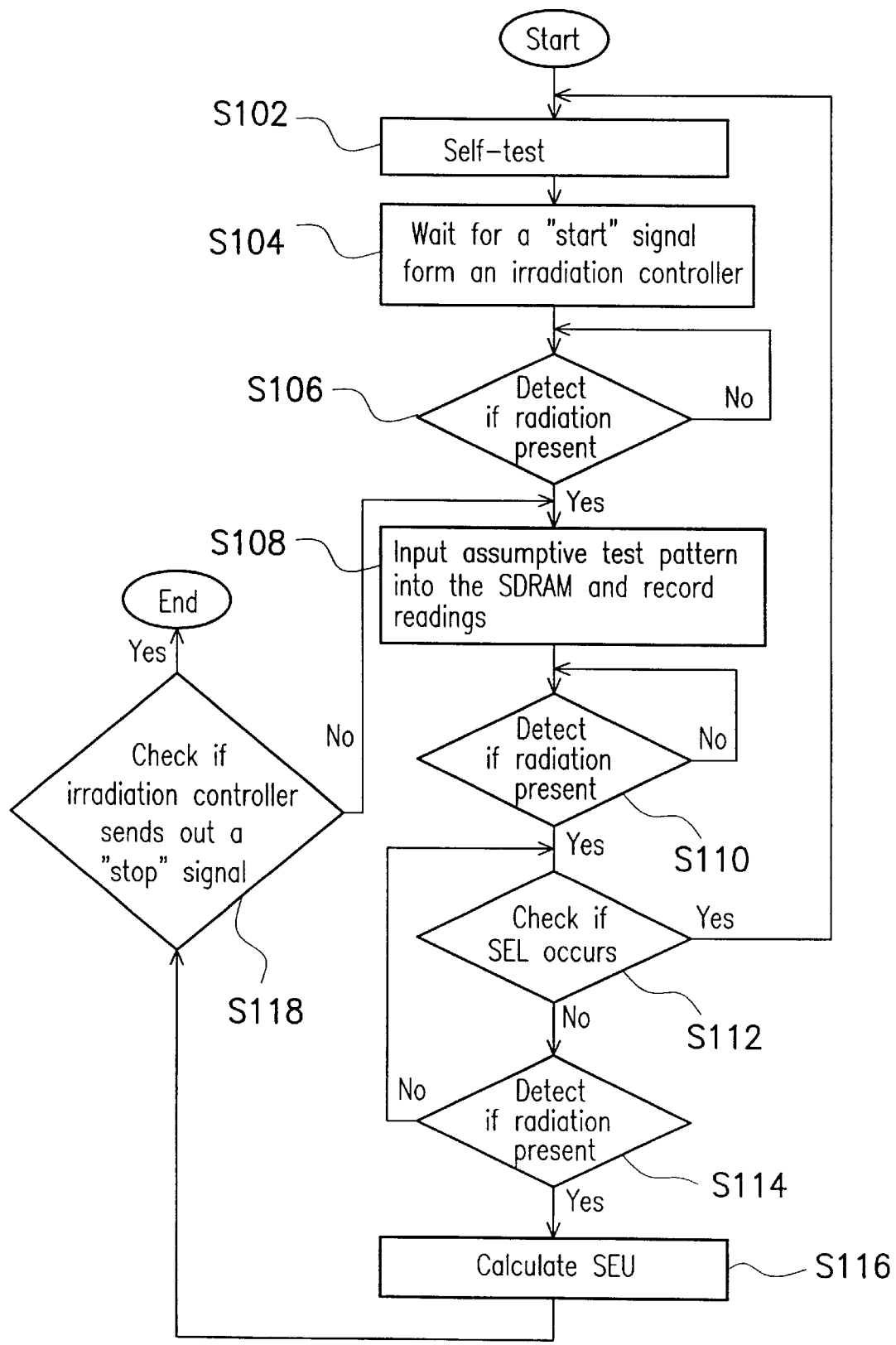
FIG. 1 is a flow chart of a method of testing for radiation for a synchronized dynamic random access memory (SDRAM) of the present invention.
Figure 2:
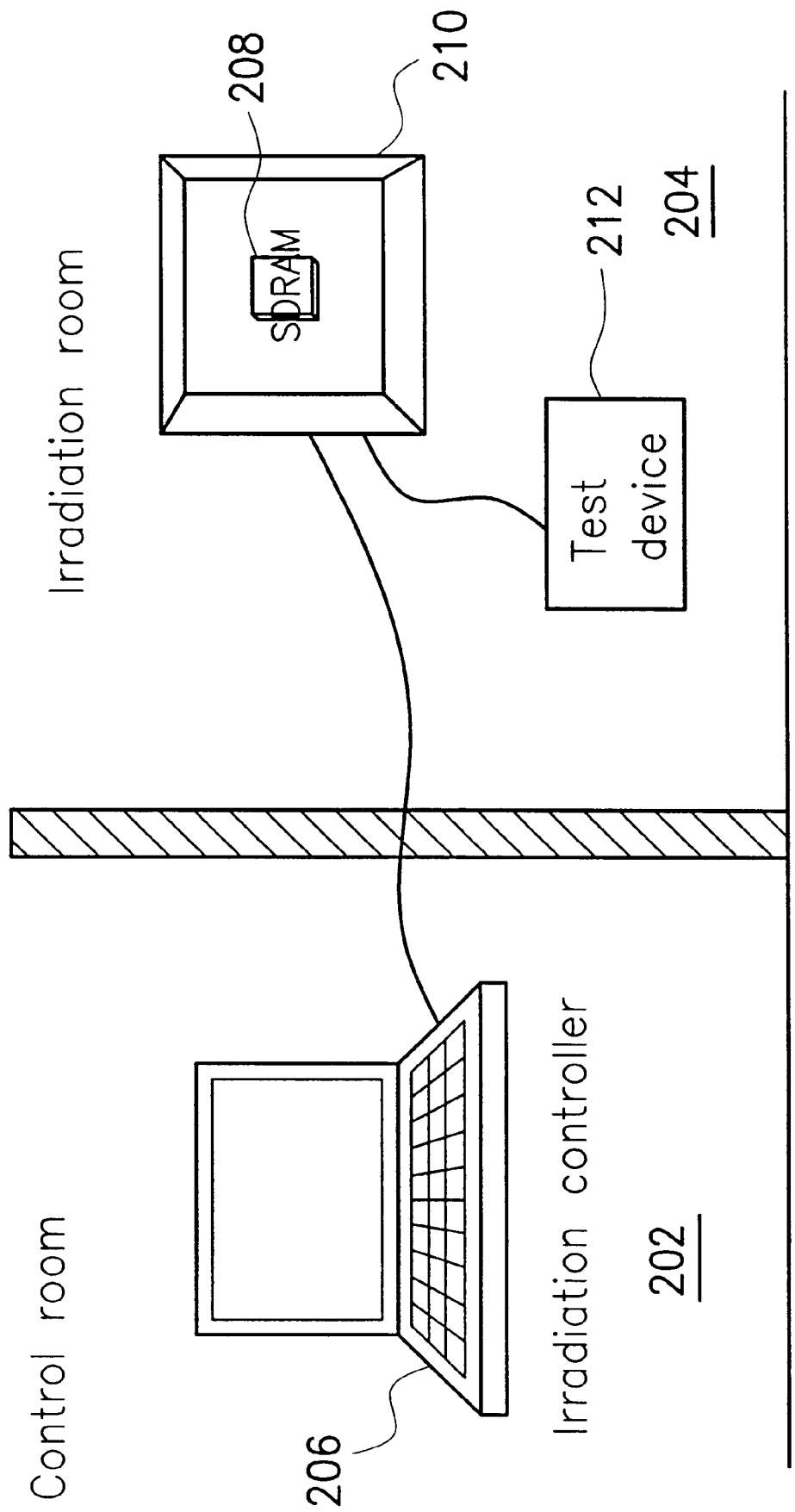
FIG. 2 is a schematic view of radiation test equipment of the present invention.

FIG. 1 illustrates a flow chart of a method of testing for radiation for a synchronized dynamic random access memory (SDRAM). FIG. 2 illustrates a schematic view of a radiation test of the present invention. FIGS. 1 and 2 show a method of testing for radiation for a SDRAM. A radiation test is carried out to produce radiation in an irradiation room 204 by an irradiation controller 206 in a control room 202. The irradiation controller 206 of the control room 202 radiates to a SDRAM 208 located in a test table 210 of the irradiation room 204. A test device 212 is connected to the SDRAM 208 in order to determine the status of the SDRAM 208.

Referring to FIG. 1, the test device 212 performs a self-test S102 before starting a radiation test in order to ensure that the test equipment functions properly to test for radiation on the SDRAM 208. If the test equipment functions properly, a start signal is transmitted from the irradiation controller 206 to the control room 202 to start the radiation test. The irradiation controller 206 produces periodic radiation continuously in the irradiation room 204.

Figure 3:
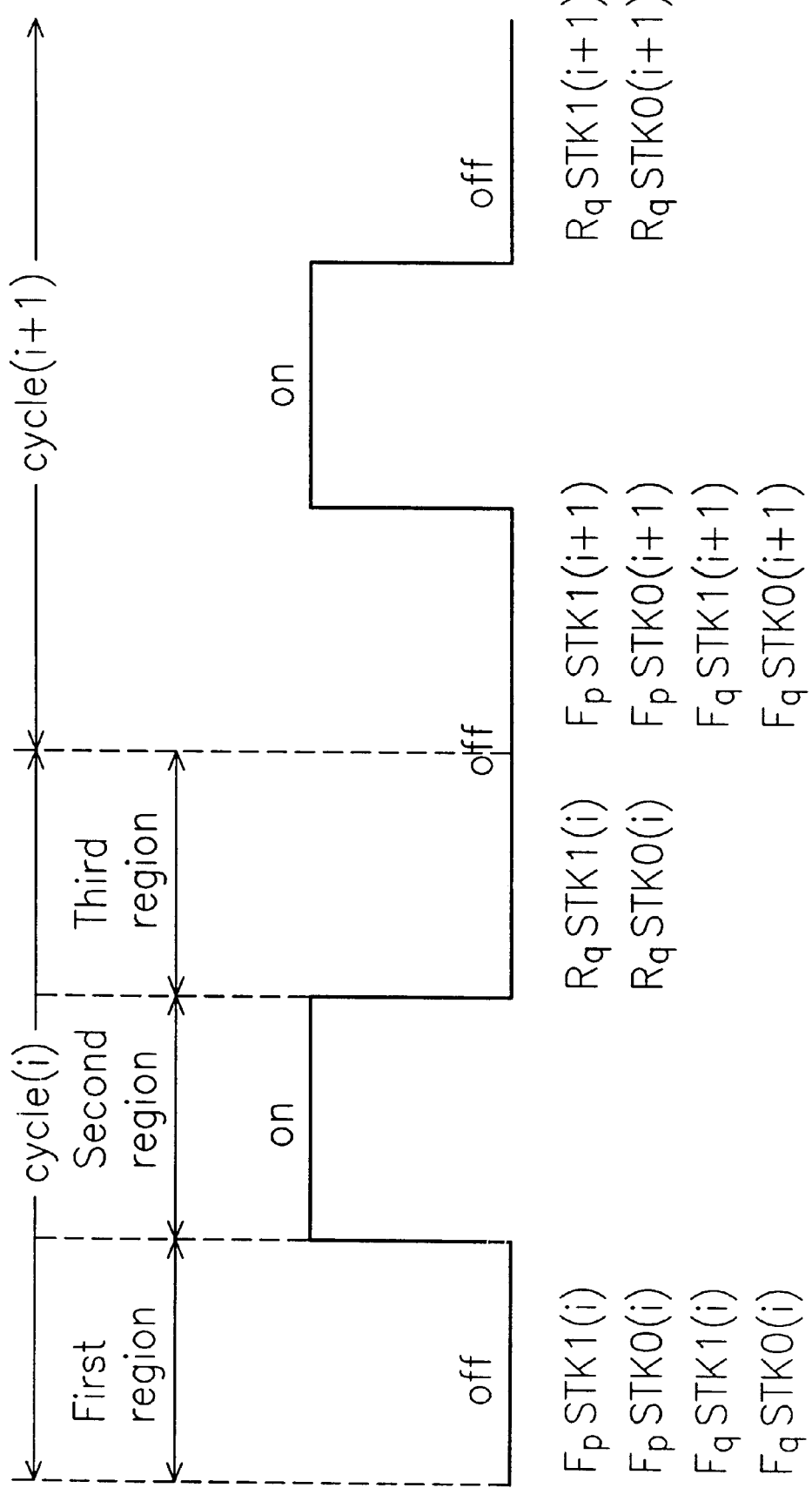
FIG. 3 is a graph of periodic cycles of the radiation test of the present invention.

FIG. 3 illustrates a graph of the periodic cycles of radiation. Referring to FIG. 3, a cycle (i) comprises a first region, a second region and a third region. The first region is the region where no radiation is produced during this period in the irradiation room 204 (S106). The second region is the region where radiation is produced in the irradiation room 204 during that period. The third region of cycle (i) is the region where no radiation is produced during this period in the irradiation room 204. Referring to FIGS. 1 and 3, a step S106 determines whether there is radiation produced in the irradiation room 204. If the test device detects radiation, a step S108 will follow, in which the irradiation controller 206 will record the readings from the irradiation room 204. If the test device does not detect any radiation, the test device waits until the SDRAM is irradiated and then continues to step S108. At step S108, an efficient algorithm for the SDRAM is calculated.

In an example test of the present invention, a test is set up in a hexadecimal pattern of P=0x5555, Q=0xaaaa (the hexadecimal pattern also can be set up with P=0xaaaa, Q=0x5555). The example test with the hexadecimal pattern is written from the test device 212 to the SDRAM 208, so that readings from the SDRAM 208 can be recorded and calculated. Formulas for the calculation are shown as below:

$$STK0C_i) = F_p STK0(i) + F_q STK0(i)$$

$$STK1(i) = F_p STK1(i) + F_q STK1(i)$$

$F_p STK1(i)$ indicates that P=0x5555 is written into the SDRAM 208, wherein the SDRAM 208 is originally "1". The test writes "0" into the SDRAM 208, but a reading obtained from the SDRAM 208 is still "1". Based on the same principle, $F_p STKO(i)$ indicates that P=0x5555 is written into the SDRAM 208, wherein the SDRAM 208 is originally "0". The test writes "1" into the SDRAM 208. However, a reading obtained from the SDRAM 208 is "0". On the other hand, $F_q STK1(i)$ indicates that Q=0xaaaa is written into the SDRAM 208, wherein the SDRAM 208 is originally "1". The test writes "0" into the SDRAM 208, but a reading obtained from the SDRAM 208 is still "1". Based on the same principle, $F_q STK0(i)$ indicates that Q=0xaaaa is written into the SDRAM 208, wherein the SDRAM 208 is originally "0". The test writes "1" into the SDRAM 208, but a reading obtained from the SDRAM 208 is still "0". STK1(i) indicates that the assumptive test pattern P and Q are both written into the SDRAM 208, which has an original reading "1". However, "0" is written into the SDRAM 208 during the test, and the final reading obtained from the SDRAM 208 is still "1". The same principle is applied to STK0(i), which indicates that assumptive test patterns P and Q are both written into the SDRAM 208, which has an original reading "0". However, "1" is written into the SDRAM 208 during the test, and the final reading obtained from the SDRAM 208 is still "0".

In the first region of the periodic cycles of the radiation, the test is written from the test device 212 to the SDRAM 208, and test readings are obtained from the SDRAM 208. These readings obtained from the SDRAM 208 provide information about the status of the SDRAM 208 before and after the radiation. According to the readings, any change of the SDRAM status during the radiation can be detected.

In step S10 of FIG. 1, the test device detects if there is radiation present. If there is radiation present, the SDRAM 208 will be at the second region shown in FIG. 3. During the period of the second region, a step S112 is carried out to check if any abnormal current has been transmitted from the test device 212 to the SDRAM 208 [a single event latch-up (SEL) status occurs]. If there is abnormal current in the SDRAM 208, the process will return to step S102. However, a predetermined amount is set by the get rapture test to set how many times SEL can occur. If SEL occurs over the predetermined amount, then the SDRAM 208 is regarded as permanently damaged. The test device 212 will then transmit a 'stop' signal to inform the irradiation controller 206 to end the radiation test. However, if there is no abnormal current in the SDRAM 208, the process will be at the third region of FIG. 3, which is also at step S114 of FIG. 1.

Referring to FIGS. 1 and 3, in step S114 of FIG. 1, if there is no radiation present, the test process is in the third region of the graph shown in FIG. 3. The test device 212 reads the test readings from the SDRAM 208 after it has been radiated. A single event upset (SEU) test is carried out. Formulas of the calculation are shown as follows:

$$SEUbr(i) = F_p STK1(i) + F_q STK0(i)$$

$$SEUar(i) = R_p STK1(i) + R_q STK0(i)$$

$$SEU(i) = SEUar(i) - SEUbr(i)$$

$R_p STK1(i)$ indicates that an assumptive test pattern '0' is written into the binary of the SDRAM 208, but after the radiation test, some readings of "1" are obtained from the binary of the SDRAM 208. The amount of readings that change from "0" to "1" is the amount of binaries after the radiation test. Based on the same principle, $R_q STK0(i)$ indicates that an assumptive test pattern "1" is written into the binary of the SDRAM 208. After the radiation test, some readings of "0" are obtained from the binary of the SDRAM 208. The amount of readings that change from "1" to "0" is the amount of binaries before the radiation test. SEUar(i) indicates the amount of binary changes in the SDRAM 208 after the radiation test. SEUbr(i) indicates the amount of binary changes in the SDRAM 208 before the radiation test. SEU(i) indicates the amount of binary changes in the SDRAM 208 before and after the radiation test.

$$SEU = \Sigma SEU(i) i=1 \text{ to } I \text{ (shown in step S116)}$$

From the above-mentioned, after a completed radiation test, each reading of the changed binary in the SDRAM 208 that is obtained before and after the radiation test is accumulated. A sum is obtained from the radiation test and is used to determine what degree of radiation the device can be subjected to in space, and to determine whether the SDRAM 208 can be used as a device in space.

In another status:

$$\mu\text{Latch-up} = \Sigma[STK\chi(i) - STK\chi(i-1)] i=2 \text{ to } I$$

From the above-mentioned, after a completed radiation test, each reading of the changed binary in the SDRAM 208 that is obtained before and after the radiation test is accumulated. A sum is obtained from the radiation test. If a value of $\mu$Latch-up is greater than a threshold value, then SEL has occurred in the SDRAM 208. From FIG. 1, when SEL occurs in the SDRAM 208, the flow process will go back to step 112. However, when the number of SEL that occur reaches a predetermined number of the get rapture test, then the SDRAM 208 is regarded as permanently damaged. The test device 212 will send out a signal to the irradiation controller to stop the radiation test.

In step S118, the test device checks whether the irradiation controller 206 sends out a 'stop' signal. If the irradiation controller 206 did not send out a 'stop' signal, the flow process will go back to step S108. However, if the stop signal has been sent out, the radiation test will end the test on the SDRAM 208.

The main characteristics of the present invention are to perform radiation tests, such as SEU, micro latch-up, SEL and get rapture tests, on the SDRAM 208. From the radiation test, we can understand the condition of the SDRAM 208 before and after the radiation test. According to the readings obtained from the SDRAM 208, errors can be determined, and corrections and improvements can be made to the SDRAM 208. On the other hand, the present invention also provides a simplified test that can determine the status of the SDRAM 208 after the radiation test by calculating those readings. Therefore, improvement can be made to the SDRAM to reduce its errors and improve its reliability in space.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of irradiating a synchronized dynamic random access memory (SDRAM) by a test device, wherein a status of the SDRAM after a radiation test is determined and calculated, the steps of the method comprising:

performing a self-test on the test device after starting;

waiting for a 'start' signal from an irradiation controller, the irradiation controller continuously producing periodic radiation, wherein each cycle of the periodic radiation includes on/off regions;

checking whether the SDRAM is in an off region, wherein no radiation is radiated on the SDRAM, and a test pattern is written from the test device to the SDRAM;

calculating readings obtained from the SDRAM, and obtaining a difference of the readings;

checking whether the SDRAM is in an on region, wherein radiation is radiated on the SDRAM, and checking if there is an abnormal current present in the SDRAM, wherein:

if there is an abnormal current present in the SDRAM, the test device goes back to the self-test step;

if there is no abnormal current present in the SDRAM, checking whether the SDRAM is in an off region;

ensuring the SDRAM is in the off region, wherein no radiation is radiated on the SDRAM, and a test pattern is written from the test device to the SDRAM;

calculating the readings which are obtained from the SDRAM before and after the test, and obtaining a difference of these readings;

checking whether a 'stop' signal is transmitted from the irradiation controller; and when the irradiation controller does not send out a 'stop' signal, returning to the step of writing a test pattern from the test device to the SDRAM, and calculating the readings which are obtained from the SDRAM before and after the test, and obtaining a difference of these readings.

2. The method of claim 1, wherein the test patterns transmitted from the test device to the SDRAM are two sets of complementary readings, and each difference of the periodic radiation of the SDRAM are accumulated to obtain a sum, but if the accumulated sum of the differences causes the abnormal current present in the SDRAM, the test device returns to the self-test step.

3. The method of claim 1, wherein when the SDRAM is in the on region, if an abnormal current is present in the SDRAM, then the test device first records the SDRAM as damaged, but when the damaged number reaches a predetermined number of a get rapture test, then the SDRAM is regarded as permanently damaged, and the test device informs the irradiation controller to end the radiation test.

4. The method of claim 1, wherein the difference sum calculated from the SDRAM before and after the radiation test are complementary readings, and each difference of the periodic radiation of the SDRAM before and after the radiation test is accumulated, and if the accumulated sum of the differences is greater than a threshold value, the test device returns to the self-test step.

* * * * *